United States Patent
Cornelius

(10) Patent No.: US 6,812,647 B2
(45) Date of Patent: Nov. 2, 2004

(54) PLASMA GENERATOR USEFUL FOR ION BEAM GENERATION

(76) Inventor: Wayne D. Cornelius, 11619 Chippenham Way, San Diego, CA (US) 92128

( * ) Notice: Subject to any disclaimer, the term of this patent is extended or adjusted under 35 U.S.C. 154(b) by 0 days.

(21) Appl. No.: 10/406,739

(22) Filed: Apr. 3, 2003

(65) Prior Publication Data

US 2004/0195972 A1 Oct. 7, 2004

(51) Int. Cl.⁷ .................................................. H01J 7/24
(52) U.S. Cl. ..................................... 315/111.41; 315/39
(58) Field of Search ...................... 315/111.41, 111.81, 315/39, 111.21; 250/427, 425, 492.2, 423 R; 313/360.1, 363.1

(56) References Cited

U.S. PATENT DOCUMENTS

| | | |
|---|---|---|
| 4,638,216 A | 1/1987 | Delaunay et al. |
| 4,778,561 A | 10/1988 | Ghanbari |
| 4,788,473 A | 11/1988 | Mori et al. |
| 4,952,273 A | 8/1990 | Popov |
| 5,111,111 A | 5/1992 | Stevens et al. |
| 5,133,826 A | 7/1992 | Dandl |
| 5,203,960 A | 4/1993 | Dandl |
| 5,284,544 A * | 2/1994 | Mizutani et al. ........ 156/345.38 |
| 5,306,985 A | 4/1994 | Berry |
| 5,350,974 A | 9/1994 | Jacquot |
| 5,366,586 A | 11/1994 | Samukawa |
| 5,466,991 A | 11/1995 | Berry |
| 5,506,475 A | 4/1996 | Alton |
| 5,523,652 A * | 6/1996 | Sferlazzo et al. ........ 315/111.41 |
| 5,841,237 A | 11/1998 | Alton |
| 5,975,014 A | 11/1999 | Dandl |
| 6,284,674 B1 | 9/2001 | Toraguchi et al. |
| 2003/0062129 A1 | 4/2003 | Ni |

* cited by examiner

Primary Examiner—Don Wong
Assistant Examiner—Chuc Tran

(57) ABSTRACT

A plasma generator particularly adapted for use as an ion beam generator. The plasma generator includes a plasma chamber body having an interior cavity and formed of a dielectric material such as boron nitride. The plasma chamber body is surrounded by a solenoidal magnet and is coupled to a radiofrequency waveguide. In the preferred embodiment both the plasma chamber body and the waveguide are composed of a dielectric material. Reductions in both the size of the chamber and the size of the waveguide, with resulting reductions in required input power, are achieved over comparable plasma generators. Use of a circularly polarized RF signal enhances coupling between the plasma and the RF signal.

16 Claims, 11 Drawing Sheets

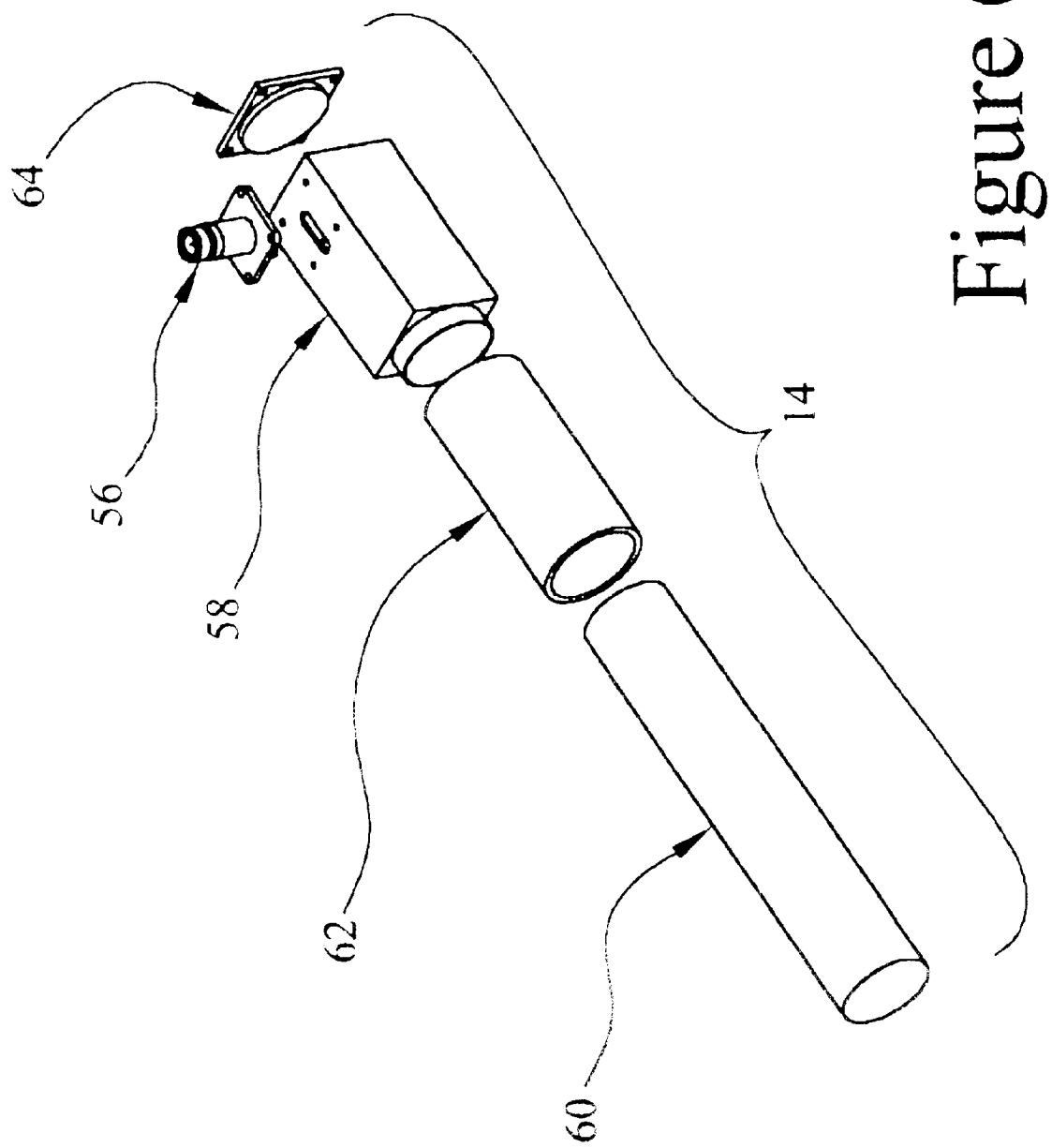

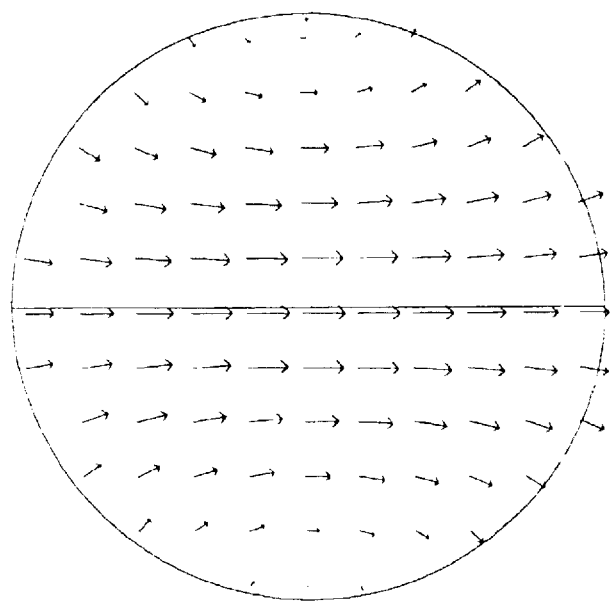
Figure 7. Electric field pattern of linearly polarized $TE_{11}$ mode in circular waveguide.
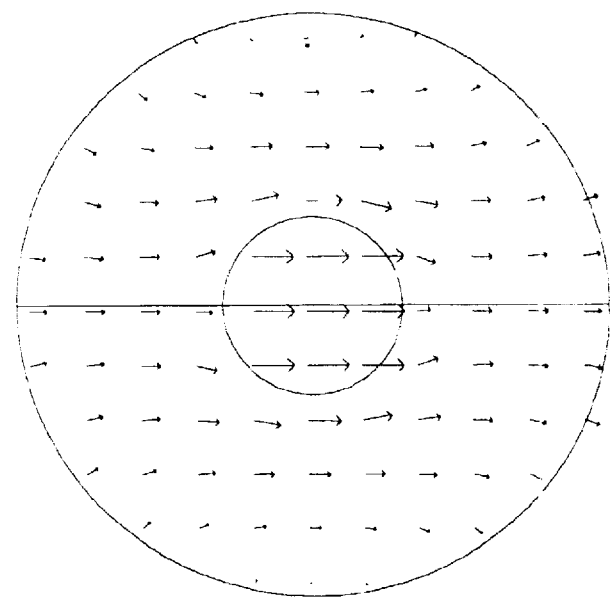
Figure 8. RF Electric field pattern in a plasma chamber with the same impedance as the geometry in figure 7.

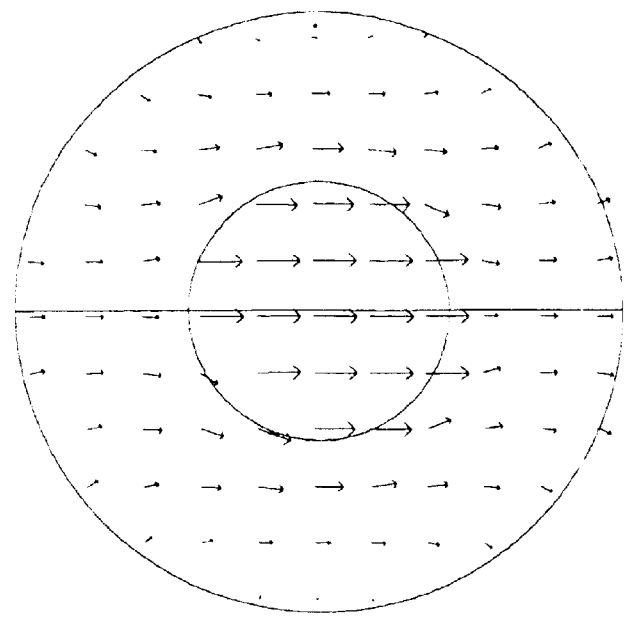
Figure 9. RF Electric field pattern in a plasma chamber with the same impedance as the geometry in figure 7
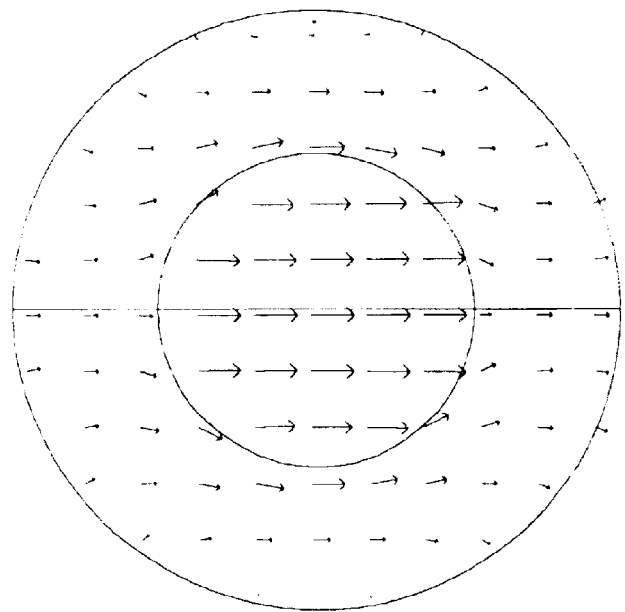
Figure 10. RF Electric field pattern in a plasma chamber with the same impedance as the geometry in figure 7

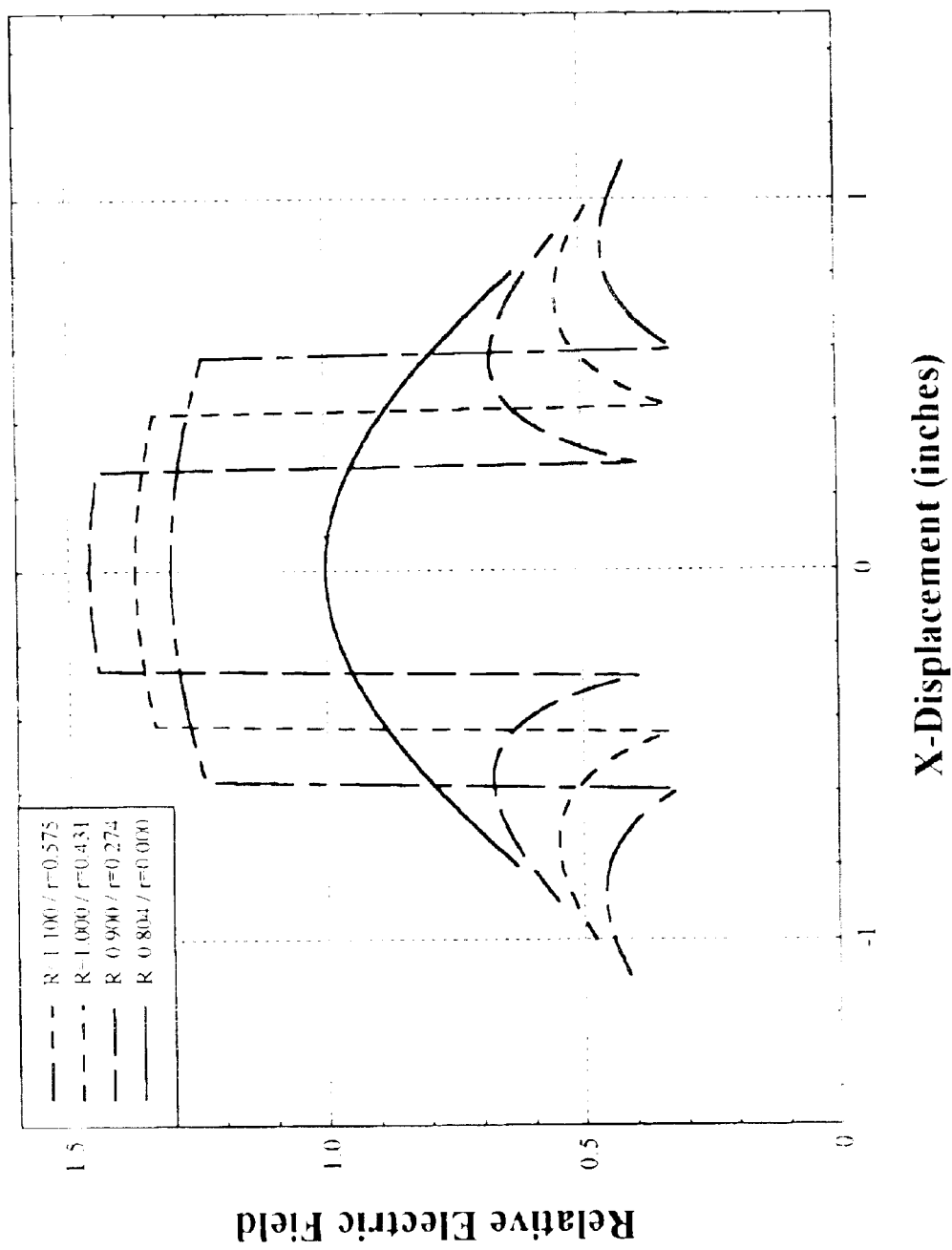
Figure 11   Comparison of electric field magnitudes measured along the horizontal line in each of figures 7 through 10

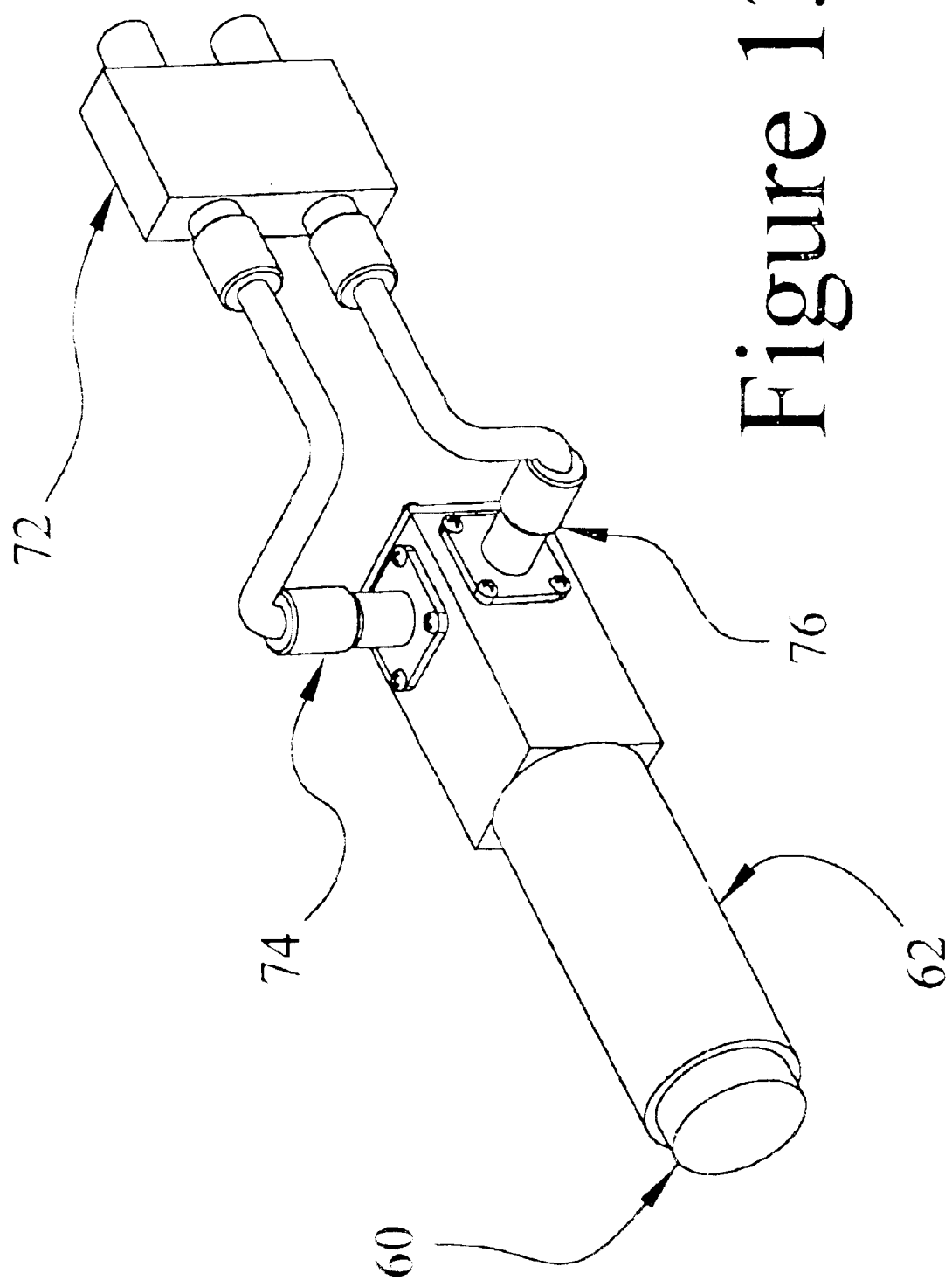

PLASMA GENERATOR USEFUL FOR ION BEAM GENERATION

BACKGROUND OF THE INVENTION

The present invention is directed to methods and apparatus for the production of high temperature gaseous plasmas. In particular, the present invention is directed to methods and apparatus for the production of plasmas for the purpose of producing ion beams.

Plasmas are created when a gas is excited to a sufficiently high energy level to ionize at least a portion of the atomic or molecular species constituting the gas, producing a high temperature collection of free electrons, positively ionized gaseous species, and neutral, non-ionized gaseous species. For various practical reasons plasmas are typically produced in low pressure plasma chambers. Due to their combination of high temperature, low pressure, and the presence of free electrons and electrically charged gaseous ions, plasmas are characterized by unique physical and electrical properties that make them useful for various purposes. For example, plasmas are used to etch, clean and otherwise modify the surfaces of solid articles, by exposure of an article to a plasma maintained in a plasma chamber.

In particular, plasmas are used to generate positively charged ion beams, by extraction of positive ions from a plasma and their acceleration through an electric field. Depending on the elemental composition of the gas used to generate the plasma, beams ranging from proton beams to beams of heavy metal ions can be produced. Such beams are useful in applications including the ion beam etching of semiconductors, the surface treatment of solid articles by ion implantation, and emerging lithographic techniques.

The phenomenon known as electron cyclotron resonance has been used for some years for the purpose of producing plasmas. Electron cyclotron resonance (ECR) occurs when free electrons in a magnetic field are subjected to a radio frequency (RF) electrical field. ECR is possible because free electrons, when in the presence a magnetic field, tend to circulate around the axis of the magnetic field at a specific frequency, which is known as the cyclotron frequency and which is characteristic of the fundamental physical properties of the electron. When an RF signal is applied to such electrons, they can be accelerated to high energies in a resonance condition, while continuing to be constrained to orbital paths around the flux lines of the magnetic field. Under appropriate resonance conditions, electrons having energies of several million electron volts (MeV) can be produced.

More importantly, if neutral gaseous species are present under such ECR conditions, collisions between the energetic electrons and the neutral gaseous species result in ionization of the gaseous species, producing positive ions as well as additional free electrons, and generating a plasma of excited electrons and positively charged ions. The neutral gaseous species may be either monoatomic gaseous species or molecular gaseous species. With sufficiently energetic electrons, multiple electrons may be stripped from atoms of higher atomic number to produce atomic ions having high positive charges.

Under appropriate conditions, the positively charged ions so generated in a plasma can be accelerated through a static electric field to produce a beam of positive ions. By continuously applying an RF power signal to the plasma, while also replenishing the gaseous species in the plasma, a continuous ion beam can be generated in this manner. Since the plasma is typically maintained only in the region where the magnetic field exists, an ion beam extracted from the region of plasma generation is useful as an isolated, directed beam of ions outside the plasma U.S. Pat. No. 4,417,178 to Geller, issued on Nov. 22, 1983, discloses an ECR ion beam source as described above. Much subsequent research has been directed to the further development of ECR-based ion beam sources of this kind. For example, considerable effort has been directed to the shaping of the magnetic field so as to contain the ionized species in the plasma chamber for as long a time as possible prior to their extraction, to thereby allow maximum ionization and thus maximize the positive charge of the ionized species that are extracted from the plasma chamber through a beam port. For example, a "double humped" magnetic field, i.e. a magnetic field having a pair of peak field strengths spaced along a common field axis, is known to increase the retention of ionic species and thus result in generation of more highly charged ion species. Under appropriate conditions as much as 70% of the gas injected into such a plasma chamber can be ionized through the use of such improvements in ECR-based ion beam generators.

Because of their rather different applications and designs, ECR ion beam generators are typically categorized as either a source of highly charged heavy ions (typically for nuclear physics applications), or as a source of higher current ions having low positive charges (+1 or+2) for ion beam accelerators or for materials processing applications. Production of hydrogen ions tends to dominate accelerator applications while sources of boron, nitrogen, carbon, oxygen, and argon ions are widely used in materials processing such as ion implantation or ion etching. ECR-based plasma generators are also used for the purposes noted above for plasmas in general, such as plasma etching and cleaning. In some applications, the low charge-state ion beam sources serve as plasma injectors for the heavy ion beam generators.

As the various applications of EIR ion beam generators have expanded, it has been sought to increase their efficiency and to reduce their size and electrical power consumption. One obstacle to the reduction in size of ECR ion beam generators has arisen from the physical characteristics of the waveguides typically used to transmit RF signals to the plasma chamber, as well as the necessity of matching the impedance of the waveguide with the impedance of the plasma chamber in order to avoid loss of RF power by reflection at the interface.

Accordingly, it is the object and purpose of the present invention to provide an improved plasma generator. More particularly, it is an object and purpose of the present invention to provide a plasma generator having both smaller physical dimensions and lower electrical power requirements, as compared with previously known plasma generators.

It is also an object and purpose of the present invention to provide an ion beam source based on such an improved plasma generator.

In particular, it is an object and purpose of the present invention to provide an improved ECR-based ion beam source having reduced size and lower power consumption relative to comparable ECR-based sources known in the prior art.

SUMMARY OF THE INVENTION

The present invention provides a plasma generator useful for the production ion beams as well as for other purposes. The plasma generator includes a plasma chamber body formed of a dielectric material and having an interior cavity which functions as a plasma chamber. A solenoidal magnet surrounds the plasma chamber body and thereby maintains a magnetic field in the cavity. The plasma chamber body is coupled to a radio frequency waveguide for introducing a radio frequency signal into the plasma chamber body. The plasma chamber body is composed of a dielectric material such as boron nitride. Because the plasma chamber body surrounds the plasma chamber and also functions as an extension of the waveguide conveying the RF signal to the plasma chamber, the application of the RF signal to the plasma is enhanced and the efficiency of plasma generation and maintenance through the phenomenon of electron cyclotron resonance is improved.

Preferably both the waveguide and the plasma chamber body are composed of a dielectric material such as boron nitride, thereby allowing for a reduction in size of both the chamber and the waveguide, while also matching the impedance of the chamber with the impedance of the waveguide so as to minimize loss of RF power by reflection at the interface.

With an appropriate beam port and apparatus for generating an electric field outside the plasma chamber, ions can be extracted from the plasma and accelerated, so as to enable the plasma generator to be readily utilized as an ion beam generator that is characterized by smaller size and lower power consumption than comparable ion beam generators not having the dielectric chamber body or the dielectric waveguide.

Further improvements in efficiency can be achieved by the use of an RF signal having a particular circular polarization, selected on the basis of the direction of the magnetic field of the solenoidal magnet, so as to optimize coupling of the RF signal to the plasma.

These and other features of the present invention will be more apparent upon consideration of the accompanying drawings and the following detailed description of a preferred embodiment.

BRIEF DESCRIPTION OF THE DRAWINGS

The accompanying Figures are incorporated in and form a part of this specification. In the Figures:

FIG. 6 is an exploded isometric view of the waveguide assembly of the ion bean generator of the foregoing Figures;

FIG. 7 is a an illustration of the calculated electric field in a solid boron nitride cylindrical waveguide;

FIG. 8 is an illustration of the calculated electric field in a boron nitride cylindrical waveguide with a central bore, having an outside diameter of 1.800 inch and an inside diameter of 0.548 inch;

FIG. 9 is a an illustration of the calculated electric field in a boron nitride cylindrical waveguide with a central bore, having an outside diameter of 2.000 inch and an inside diameter of 0.862 inch;

FIG. 10 is a an illustration of the calculated electric field in a boron nitride cylindrical waveguide with a central bore, having an outside diameter of 2.200 inch and an inside diameter of 1.150 inch;

FIG. 11 is a graph showing the various electric field magnitudes, measured along the horizontal lines of FIG. 7 through 10;

FIG. 13 illustrates an alternative waveguide assembly also designed to introduce a circularly polarized RF signal into the ion beam generator.

The accompanying drawings illustrate the construction and function of the present invention particularly when taken with the following detailed description of the invention.

DETAILED DESCRIPTION OF THE INVENTION

Figure 1:
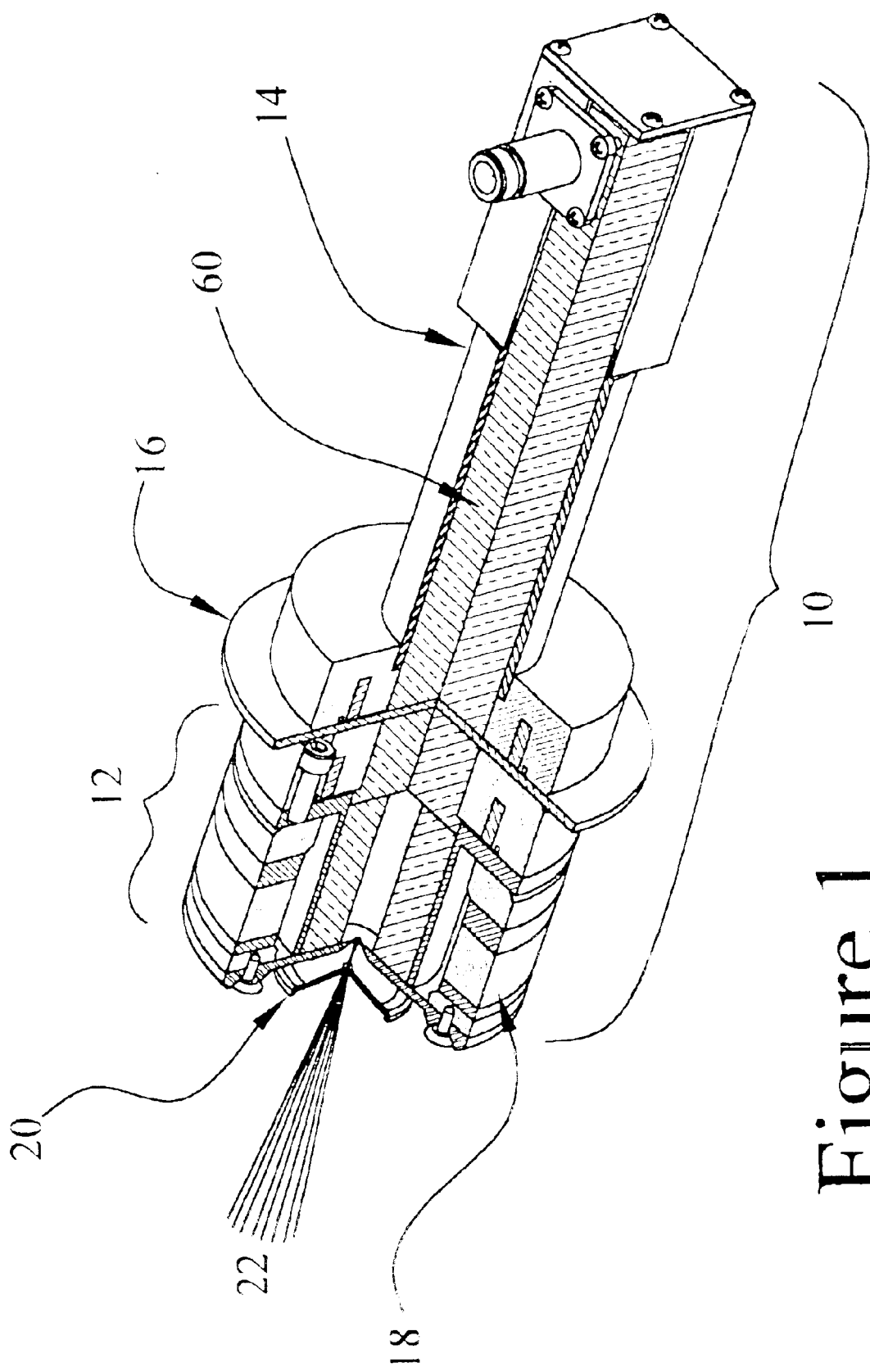
FIG. 1 is an isometric cut-away view of an ion beam generator constructed in accordance with the present invention.
Figure 2:
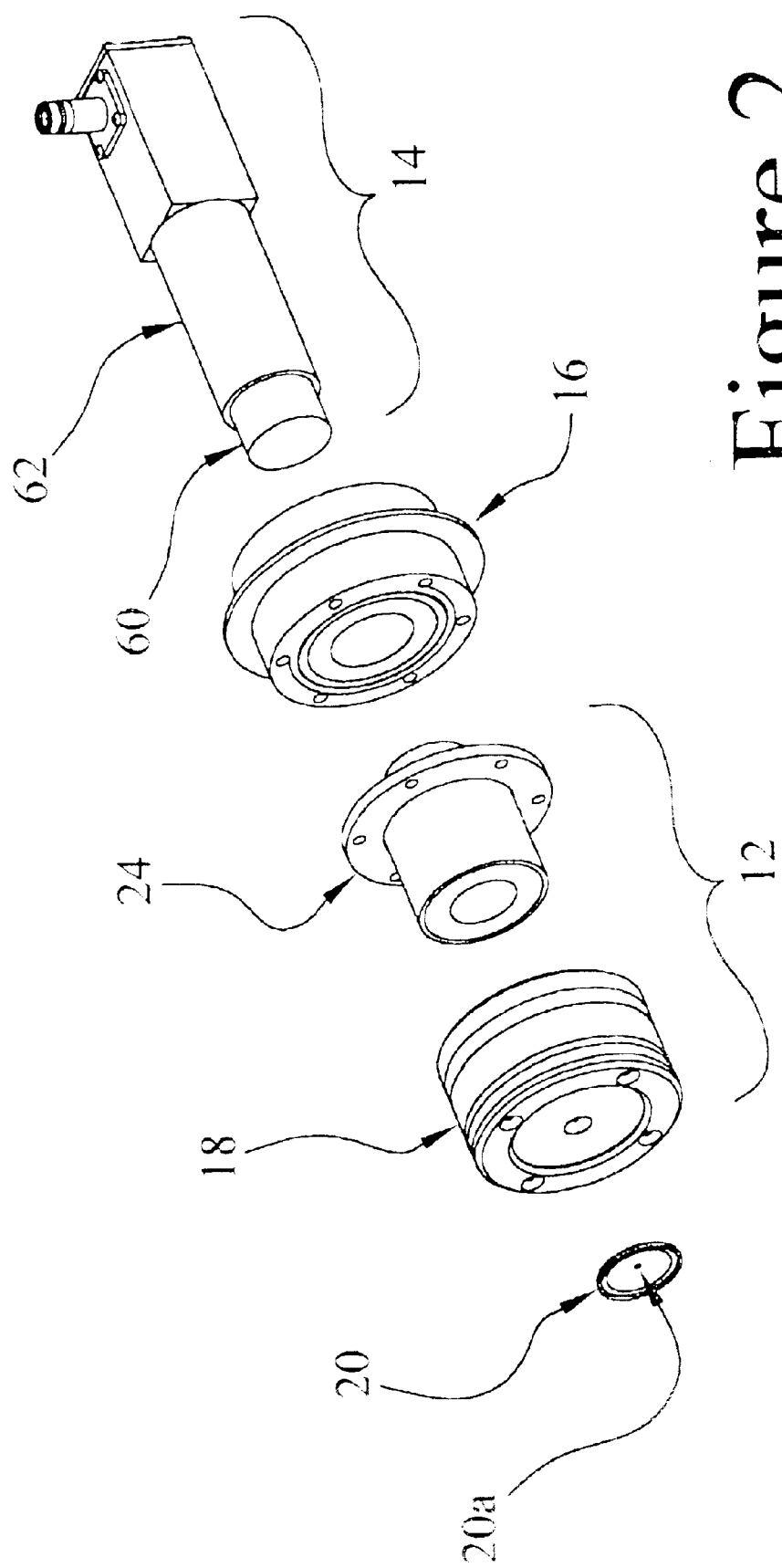
FIG. 2 is an exploded isometric view of the ion beam generator of FIG. 1.

Referring to the Figures, there is illustrated in FIGS. 1 and 2 a preferred embodiment of an ion beam generator 10 that is based on the plasma generator of the present invention. The ion beam generator 10 generally includes a cylindrical plasma chamber assembly 12 that is connected to a waveguide assembly 14 through a high voltage waveguide isolator 16. The plasma chamber assembly 12 includes a solenoidal permanent magnet assembly 18.

As discussed in greater detail below, the plasma chamber assembly 12 is maintained at an elevated electrical potential during operation. Briefly, a radio frequency power signal is introduced into the plasma chamber assembly 12 from the waveguide assembly 14 to produce a plasma. The surrounding magnet assembly 18 provides the axial magnetic field which is necessary to create an electron cyclotron resonance condition. A cylindrical, grounded electrode 20 extracts ions from the plasma to produce an ion beam 22.

In the description that follows, and for purposes of explanation, the terms proximal and distal will be used in various contexts to refer to elements of the ion beam generator 10 which are relatively closer to, or relatively farther from, respectively, the waveguide assembly 14. For example, in operation the ion beam 22 is emitted from the distal end of the ion beam generator 10.

Figure 3:
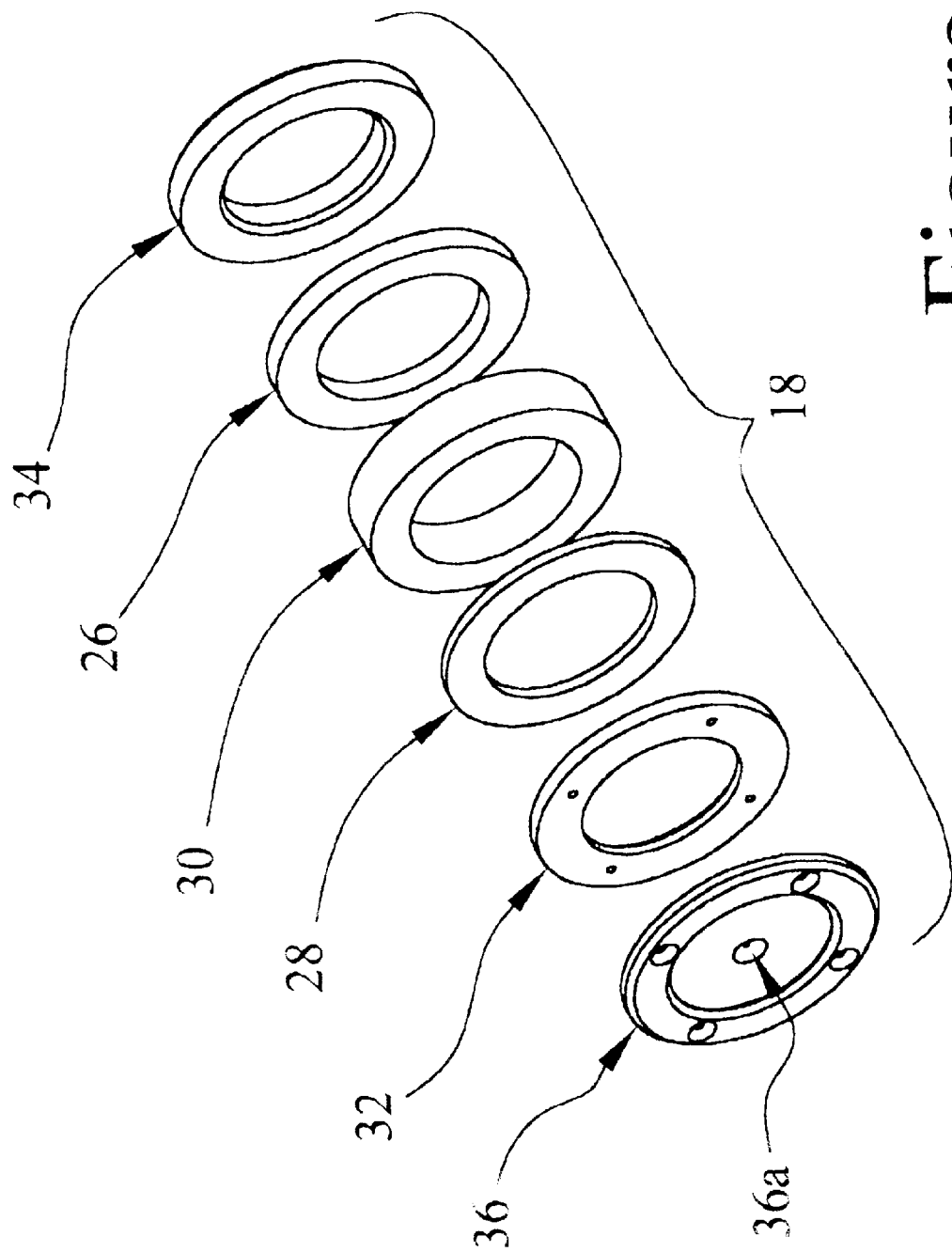
FIG. 3 is an exploded isometric view of the permanent magnet assembly of the ion beam generator of FIGS. 1 and 2.

Referring to FIGS. 2 and 3 in particular, the magnet assembly 18 of plasma chamber assembly 12 surrounds a plasma chamber insert 24. Magnet assembly 18 includes two permanent magnets 26 and 28 which are in the form of annular rings and which are separated by an annular steel spacer ring 30. Magnets 26 and 28 are constructed such that the axes of their magnetic fields are coaxial with each other and are also aligned with the central cylindrical axis of the plasma chamber assembly 12. The magnet assembly 18 further includes two steel end spacer rings 32 and 34, and a circular end plate 36 having a central orifice 36a through which ions are emitted.

Figure 4:
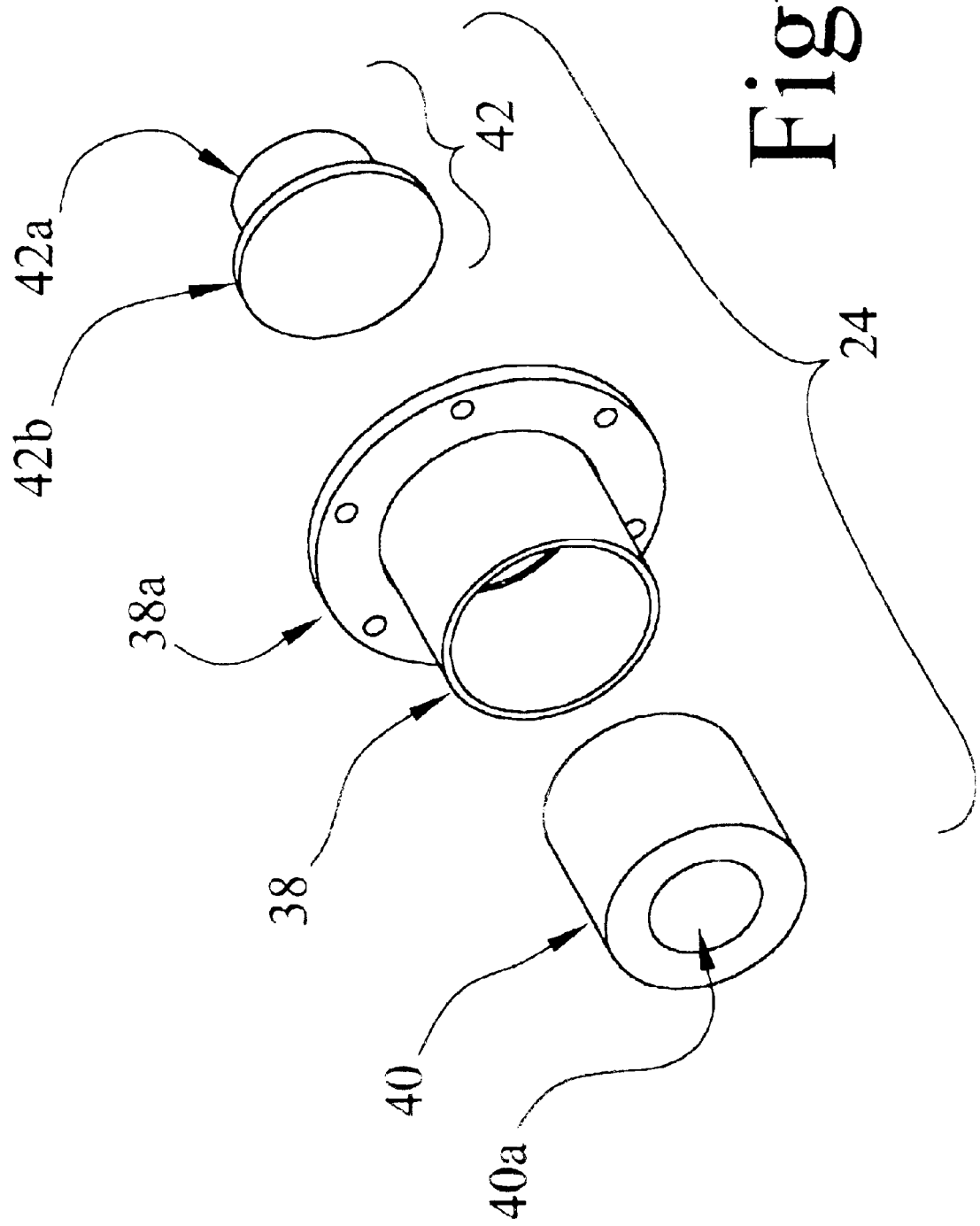
FIG. 4 is an exploded isometric view of the plasma chamber insert of the ion beam generator of the foregoing Figures.

The plasma chamber insert 24 (FIG. 4) includes a stainless steel cylindrical tube 38 which has an integral annular flange 38a at its proximal end. The plasma chamber insert 24 further includes a cylindrical boron nitride (BN) plasma chamber body 40 which is inserted into the steel tube 38. The plasma chamber body 40 includes a plasma chamber 40a which is formed as a cylindrical axial bore in body 40, and in which plasma is produced and from which ions are emitted. The plasma chamber body 40 is machined from commercially available solid, polycrystalline boron nitride, sometimes known as 'white graphite.' Boron nitride has a dielectric constant of approximately 4.5 and is a refractory material that can withstand the high temperatures of a plasma generated in the chamber 40*a* of the plasma chamber body 40.

The plasma chamber insert 24 further includes a boron nitride end plug 42 formed from of a single piece of solid boron nitride that is machined to consist of a boron nitride cylinder 42*a* integrally connected to a circular boron nitride disk 42*b*. When assembled, the boron nitride disk 42*b* abuts the end of the boron nitride plasma chamber body 40; and the plasma chamber insert 24 is inserted into the bore of the magnet assembly 18.

Figure 5:
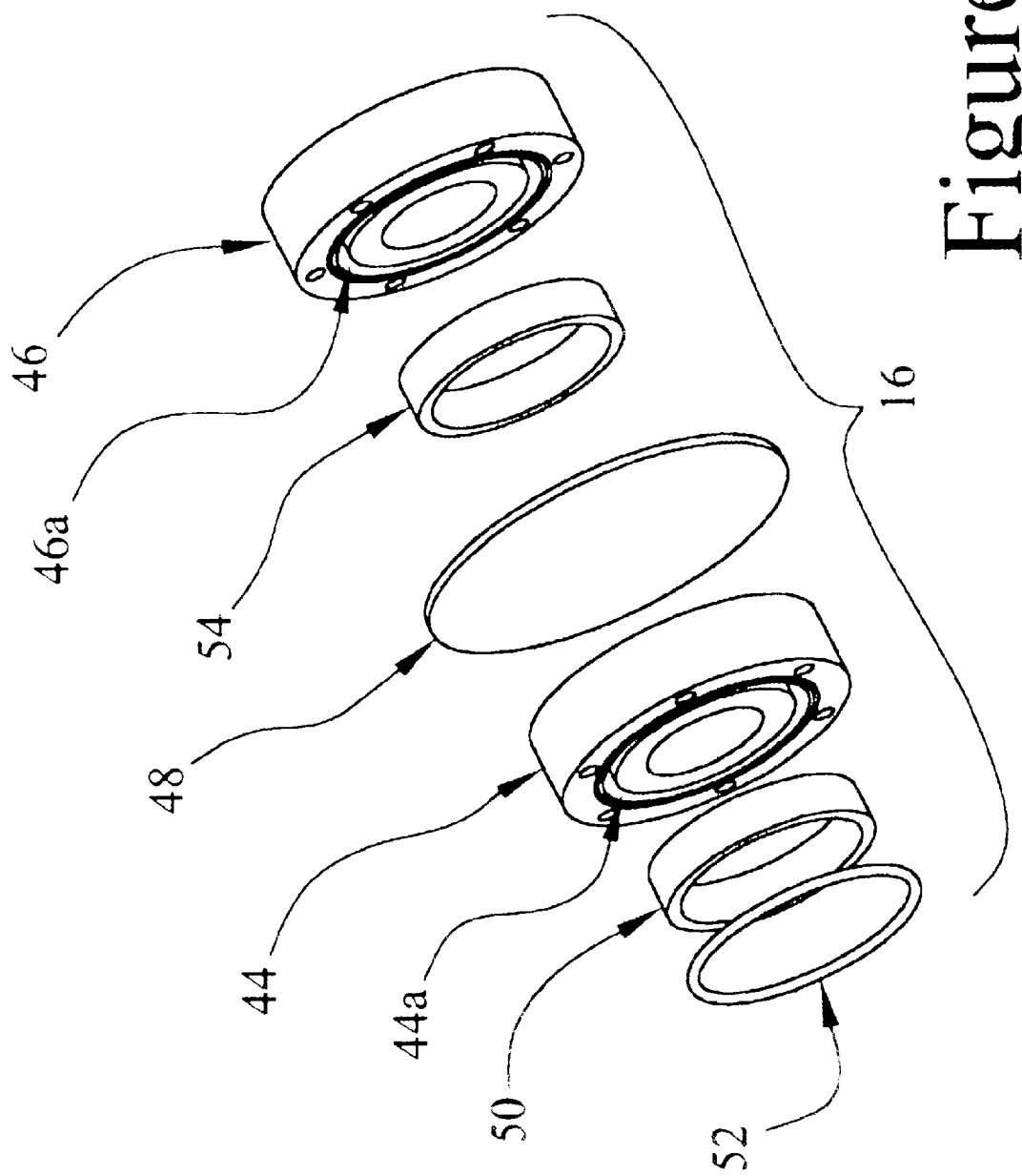
FIG. 5 is an exploded isometric view of the high voltage waveguide isolation assembly of the ion beam generator of the foregoing Figures.

Referring to FIG. 5, the high voltage waveguide isolator 16 includes distal and proximal steel tubular cylindrical bodies 44 and 46, respectively, which abut and which are separated from one another by a circular sheet 48 of polyfluorocarbon polymer or other suitable high voltage insulator. The distal cylindrical body 44 includes an annular groove 44*a* which opens onto its distal face and which contains an annular boron nitride ring 50. An O-ring 52 is provided to seal the cylindrical body 44 against the flange 38*a* of the steel tube 38.

The proximal cylindrical body 46 likewise includes an annular groove 46*a*, which contains a boron nitride ring 54. When fully assembled, the boron nitride rings 50 and 54, together with the cylindrical bodies 44 and 46, function as a pair of quarter wave choke joints which prevent RF radiation from leaking out of the assembly and possibly endangering nearby personnel. The use of such choke joints is a standard practice among designers of RF equipment. However, they are traditionally air-filled. Filling the quarter-wave joints with a dielectric such as boron nitride reduces the length required to obtain the quarter-wave resonator effect that is necessary to block leakage of the RF fields.

The waveguide assembly 14 (FIGS. 1, 2 and 6) includes a conventional coaxial RF fitting 56, commonly known as a Type N connector as shown, through which is introduced a 2,450 megahertz (MHz) RF signal that is produced by a suitable power supply (not shown). 2,450 MHz power supplies are common sources of RF signals and are commercially available from a number of sources. The RF signal is fed through a housing 58 to a solid, cylindrical boron nitride waveguide 60 which is contained in a non-magnetic metallic tube 62. The open end of the housing 58 is closed with a non-magnetic metallic cap 64 so that RF energy flows down the boron nitride waveguide 60 and away from the RF connector 56. It is necessary to match the impedance of the RF connector (typically 50 Ohms) to the impedance of the waveguide 60, which is approximately 300 Ohms. This matching is accomplished in a manner consistent with standard RF practice, whereby the open end of the RF connector is either attached to a loop of suitable size (known as H-field coupling), or to a stub antenna of length chosen to match the impedance of the waveguide (known as E-field coupling). In the embodiment shown the boron nitride waveguide 60 has a diameter of approximately 4.08 centimeters. The use of solid boron nitride as the waveguide for the 2,450 MHz signal permits a reduction in the size of the waveguide from an approximately 8 cm (diagonal) conventional WR-284 rectangular waveguide, or a reduction from the conventional 7.3 cm diameter circular hollow waveguide that would ordinarily be used for a 2,450 MHz input signal.

Boron nitride is the preferred dielectric material for fabrication of the waveguide 60, the end plug 42, the plasma chamber body 40, and the components of the choke joints because of its ready machinability, high thermal conductivity, and low loss tangent (explained below). However, other dielectric materials, especially refractory dielectrics such as aluminum nitride, may also be used for these components. The transverse dimension of the components varies proportionally with the square root of the ratio of the respective dielectric constants.

In assembly, the plasma chamber insert 24 is inserted into the bore of the magnet assembly 18, and the combined magnet assembly 18 and plasma chamber insert 24 are connected to the high voltage waveguide isolator 16 by screws (shown in FIG. 1) which affix the flange 38*a* to cylindrical body 44 of the waveguide isolator 16. The tube 62 of waveguide assembly 14 is normally permanently attached to the isolator body 46 so that the cylindrical boron nitride waveguide 60 penetrates all the way through the body 46 and abuts the insulating sheet 48. The waveguide assembly 14, including isolator body 46, is then clamped to the opposite or proximal side of the waveguide isolator 16. In complete assembly, the boron nitride waveguide 60 abuts the insulating sheet 48, and the sheet 48 in turn abuts the boron nitride plug 42, which in turn abuts the boron nitride plasma chamber body 40. The result is a boron nitride waveguide which is continuous, except for the break effected by the insulating sheet 48, from the RF source to the plasma chamber 40*a* defined by the bore in the plasma chamber body 40.

The insulating sheet 48 permits the plasma chamber assembly 12, including the magnet assembly 18 and the plasma chamber insert 24, to be maintained at an elevated voltage of approximately 10 to 50 kilovolts relative to both the grounded waveguide assembly 14 and the grounded electrode 20, so as to generate the electric potential necessary to accelerate a beam of ions generated in the plasma chamber 40*a* through the orifices 36*a* and 20*a* and thus out of the ion beam generator 10.

It will be understood that the conductive metallic components identified above as being made of stainless steel may also be made of copper or other suitable metals. The cylindrical bodies 44 and 46 of the waveguide isolator 16 are preferably made of nonmagnetic metals.

A gas to be used for generation of an ion beam may be introduced into the plasma chamber 40*a* through any suitable orifice (not shown), which due to the small amounts of gas used may be located at various places within the plasma chamber assembly 12. In operation, the entire ion beam generator 10 is attached to an evacuated chamber and is electrically insulated from any beam target at which the ion beam 22 may be directed. Typical gas pressures inside the plasma chamber range from $10^{-5}$ Torr for sources of highly charged ions to $10^{-1}$ Torr for high current sources of ions with low charge states and for plasma generator applications.

In further explanation of the operation of the invention, the wavelength of a radio frequency signal is proportional to the square root of the dielectric constant of the material in which the signal is traveling. Since boron nitride has a dielectric constant of 4.5, whereas air or vacuum has a dielectric constant of 1.0, a hollow tubular waveguide 8 cm in diameter can be replaced with a solid boron nitride cylindrical waveguide approximately 4 cm in diameter. Reducing the size of the waveguide results in a smaller aperture into the plasma chamber. However, to prevent reflection at the interface, it is also necessary to match the impedance of the chamber with the impedance of the waveguide. The impedance of the boron nitride waveguide is approximately 300 ohms. The impedance of the plasma chamber can be matched to the impedance of the boron nitride waveguide by appropriate selection of the outside and inside diameters of the boron nitride plasma chamber body 40. Hence the volume of the plasma can be reduced to a size significantly smaller than the free-space wavelength of the RF signal. Without the dielectric plasma chamber body, the RF signal would not propagate into such a small space and would be reflected at the interface. Also, because the RF power required to maintain a plasma is proportional to the plasma volume, the reduction in the size of the plasma volume reduces the power requirements of the ion beam generator assembly.

An important additional benefit of using a dielectric plasma chamber body is the enhancement of the RF electric fields in the region of the plasma Larger electric fields produce significant benefits in terms of electron acceleration rates and in initiating plasma formation in the chamber. The larger electric field overcomes the well known difficulty in initiating plasma formation from a cold start, particularly after the generator has been turned off for a period of time and all free electrons have recombined with positive ions. A higher electric field in the chamber is more effective at ionizing the first few atoms needed to start the ECR discharge process.

This enhancement of the electric field in the plasma chamber is a result of the difference between the dielectric constants of the two components of the plasma chamber body, namely boron nitride and the vacuum, or near vacuum, in the bore of the chamber body. In this regard, the integral of the electric field along a diameter between the walls of a plasma chamber is equal to the voltage difference between the opposite walls. The electric polarizability of the dielectric material decreases the electric field inside the dielectric material to an extent proportional to the value of the dielectric constant. Since the field integral has a constant value and the contribution of the electric fields inside the dielectric is reduced, the contribution of the electric fields in the vacuum region must increase. Hence the electric field in the vacuum region is greater relative to a plasma chamber not surrounded by a dielectric plasma chamber body.

FIG. 7 shows the result of a calculation of the RF electric field profile produced in the solid boron nitride waveguide (the classic $TE_{11}$ mode in a circular waveguide). In FIG. 7, and in similar subsequent Figures, the lengths of the arrows indicate the magnitudes and directions of the RF electric field at the locations of the tails of the arrows. The electric field magnitude along the horizontal line bisecting the upper and lower half is shown in FIG. 11. The OD/ID ratios of the boron nitride plasma chamber body in FIGS. 8 through 10 were chosen to match the impedance of the solid boron nitride waveguide of FIG. 7.

FIG. 8 shows results of a calculation of the RF electric field inside a boron nitride plasma body with an outside diameter of 1.800 inch and in inside diameter of 0.548 inch. Note that the arrows inside the central bore (the plasma chamber) are significantly longer than the arrows inside the boron nitride dielectric. The electric field magnitude along the horizontal line bisecting the upper and lower half is also shown in FIG. 11.

FIG. 9 shows results of a calculation of the RF electric field inside a boron nitride plasma body with an outside diameter of 2.000 inch and in inside diameter of 0.862 inch. Note that the arrows inside the central bore (the plasma chamber) are significantly longer than the arrows inside the boron nitride dielectric. The electric field magnitude along the horizontal line bisecting the upper and lower half is also shown in FIG. 11.

FIG. 10 shows results of a calculation of the RF electric field inside a boron nitride plasma body with an outside diameter of 2.2000 inch and in inside diameter of 1.150 inch. Note that the arrows inside the central bore (the plasma chamber) are significantly longer than the arrows inside the boron nitride dielectric. The electric field magnitude along the horizontal line bisecting the upper and lower half is also shown in FIG. 11.

FIG. 11 shows the relative RF electric field magnitudes along the horizontal line bisecting the various plasma chamber configurations for FIGS. 7 through 10. The various curves are labeled with the outer radius (R) and the inner radius (r) of the boron nitride body 40. Note the increased RF electric field magnitude inside the bore of the plasma chamber body 40, compared with the RF electric field inside the solid boron nitride waveguide (the solid curve with R=0.804/r=0.000). Each configuration shown in FIGS. 8 through 10 was developed to have an impedance equal to that of the dielectric-filled waveguide (300 ohms). The enhancement in electric field, of up to 46% for one configuration shown in FIG. 11, is easily visible as the discontinuity at the interface between the vacuum and the dielectric material. This enhancement is larger as the size of the central bore decreases. The optimal design of the plasma chamber represents a compromise between enhanced electric field, the proximity of the dielectric walls to the ion extraction aperture, the ratio of plasma volume to surface area, and impedance matching of the RF signal from the waveguide into both the empty plasma chamber and the plasma chamber when filled with plasma.

Each configuration used in producing the curves in FIG. 11 has an impedance equal to that of the dielectric-filled waveguide. As a result, the RF energy is matched from the waveguide into the empty plasma chamber. The amplitude of the RF electric field increases quickly when the RF power is turned on, helping to liberate the crucial first few free electrons that catalyze the ECR plasma production process. Once the plasma has been initiated, the impedance of the plasma drops to a few ohms as the plasma density increases. This drop changes the RF geometry of the chamber to that of a coaxial cable with a "lossy" center conductor. Careful design of the properties of the plasma chamber and the RF window using conventional RF impedance design principles can result in an impedance match under these conditions as well. Hence the RF power source remains matched to the ion source under all operating conditions.

With a plasma chamber formed within a larger plasma chamber body, the waveguide impedance can be matched to that of the plasma chamber under all conditions, i.e., when the plasma chamber is filled with plasma as well as when no power applied, thereby resulting in improved performance and a more compact plasma chamber design. The additional benefit of this approach is that the overall dimensions of the ion source can be substantially reduced. The minimum diameter of the plasma chamber is defined by the effective wavelength of the RF signal in the dielectric. Higher dielectric constants result in smaller dimensions. The increased RF electric field due to the dielectric loading of the plasma chamber is an additional benefit of this approach. The practical limit of this approach will be reached when the ratio of plasma volume to surface area decreases enough that wall interactions begin to dominate the properties of the plasma An additional benefit of this approach is that the plasma chamber is located and sized to be suspended inside an RF-transparent material, so that the RF radiation can emerge into the chamber from nearly all directions. This contrasts with the conventional approach wherein the RF radiation is introduced through the metallic walls of the plasma chamber via an opening that is less than or equal to the transverse dimensions of the waveguide.

It is important to note that all dielectric materials have inherent RF losses. These loses are characterized by a parameter known as the loss tangent. The loss tangent is equal to the imaginary part of the dielectric constant, which is responsible for power dissipation, divided by the real part. Boron nitride is an excellent choice in this application because it has a low loss tangent (0.001), excellent thermal conductivity, and is easily fabricated into the desired shapes. The theoretical dielectric losses of the cylindrical waveguide are about 1%. Because active cooling is a normal part of any ion source design, this loss is tolerable and readily accommodated.

It should be further noted that in this application a waveguide that is circular in cross section is preferred over a waveguide that is, for example, rectangular in cross section, because a circular waveguide supports circularly polarized RF radiation, whereas a rectangular waveguide does not. Further in this regard, it is known that a right-hand circularly polarized RF signal couples strongly to an "over-dense" plasma (discussed below), whereas a left-hand circularly polarized RF signal is completely reflected at the plasma boundary.

In this regard, a plasma that is not exposed to a magnetic field is characterized by having a plasma frequency which is a function of the electron density of the plasma RF radiation is reflected from the plasma at frequencies below the plasma frequency and is transmitted at frequencies above the plasma frequency. Some RF radiation must penetrate the plasma for absorption to occur. At low plasma densities, the RF signal penetrates the plasma and couples to the electrons. As the plasma density increases, to a level near the critical plasma density, or the density above which reflection occurs, the RF signal begins to be reflected at the plasma interface. This allows the plasma to cool and its density to decrease. Decreasing the plasma density allows penetration and absorption of the RF signal, increasing the plasma density. In this manner the plasma density is stabilized to a value near the critical density that is determined by the RF signal frequency. In the presence of a magnetic field, other plasma excitation mechanisms allow a higher plasma density to be achieved. Without the magnetic field, the plasma density would stabilize at a value no more than a few percent of the density needed for efficient ion generation.

The magnetic field is critical for producing the "over-dense" plasmas needed for efficient plasma processing or ion beam production. The coupling between the plasma and the magnetic field produces vibrational and rotational plasma modes that can also couple strongly to the RF signal. These so-called "upper hybrid" modes couple strongly to the RF signal having the circular polarization whose rotation about the magnetic field is in the same direction as the rotation of the electrons about the magnetic field. It is primarily this process that is responsible for an increase in the plasma density by as much as 100 times the critical plasma density. The IRF signal having the opposite circular polarization does not couple to the upper hybrid modes and is thus reflected and largely wasted.

Figure 12:
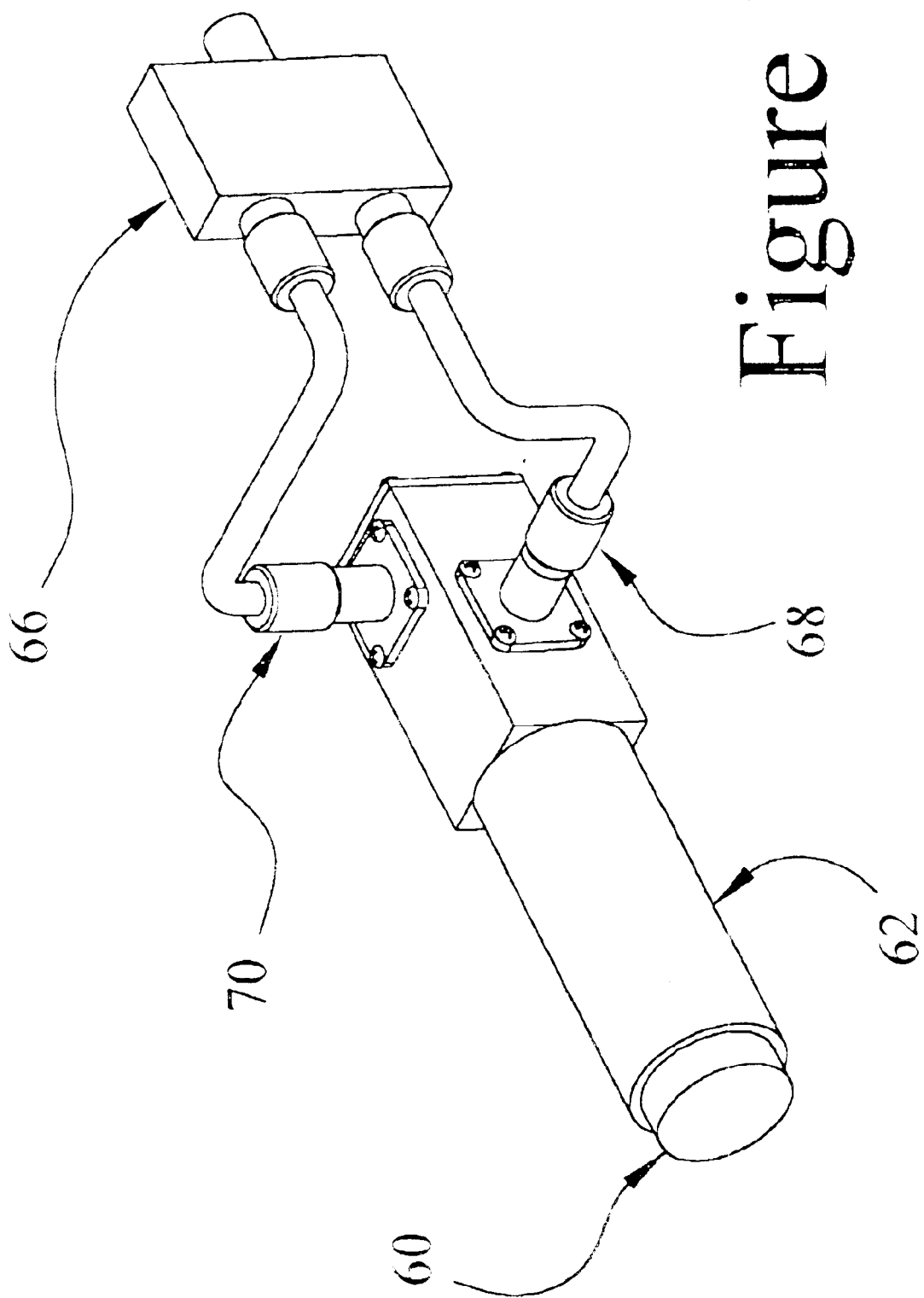
FIG. 12 illustrates a waveguide assembly designed to introduce a circularly polarized RF signal into the ion beam generator.

Since linearly polarized RF radiation consists of equal amounts of right- and left-hand circularly polarized RF radiation, up to half the RF energy can be wasted in the plasma generation process. Thus the power efficiency of the plasma generator can be increased by the use of a circularly polarized RF power signal. A circularly polarized RF signal can be generated by the use of a 3 dB power splitter 66 and two type-N RF connectors and 68 and 70, shown in FIG. 12, located on adjacent walls of the square housing 58 and which are longitudinally spaced 45° apart in phase, thus producing a circularly polarized signal in the waveguide. For a 2,450 megahertz signal in the boron nitride waveguide 60, this spacing is approximately 1.09 inches (or odd multiples thereof). Alternatively, in FIG. 13, the RF signal can be passed through a hybrid coupler 72 to split the RF radiation into two components separated by 45° in phase, which are introduced through two type-N connectors 74 and 76 located on adjacent walls at the same longitudinal position.

The ion beam generator 10 described above and illustrated in the Figures is perhaps the best known application of the present invention. However, as the invention lies in the use of a dielectric plasma chamber body that results in a more compact and lower power plasma generator, the invention is useful in any application requiring the production of a plasma. For example, plasma cleaning or etching of articles can be accomplished with more compact and lower power plasma generators constructed in accordance with the present invention.

It will be understood that, while the present invention has been described by reference to a preferred embodiment, various modifications, deviations and substitutions which may be apparent to one of ordinary skill in the art may be made without departing from the present invention, and that consequently the scope of the invention is defined solely by the following claims.

What is claimed is:

1. A plasma generator comprising:
   a plasma chamber body having an interior cavity, said plasma chamber body being formed of a dielectric material;
   a magnet surrounding said plasma chamber body, said magnet being operable to maintain
   a magnetic field in said cavity; and
   a radio frequency waveguide assembly coupled to said plasma chamber body for introducing a radio frequency signal into said plasma chamber body, said waveguide assembly including a solid waveguide composed of a dielectric material;
   whereby a plasma may be generated and maintained in said cavity by the phenomenon of ion cyclotron resonance upon introduction of a gas into said cavity and the introduction of the radio frequency signal through said waveguide.

2. The plasma generator defined in claim 1 wherein said plasma chamber body and said waveguide are matched in impedance so as to minimize reflection of said radio frequency signal at the interface between said plasma chamber body and said waveguide.

3. The plasma generator defined in claim 2 wherein said plasma chamber body is coupled to said waveguide through a high voltage waveguide isolator.

4. The plasma generator defined in claim 3 wherein said waveguide isolator includes at least one quarter wave choke joint for preventing emission of radio frequency radiation.

5. The plasma generator defined in claim 1 wherein said dielectric material is boron nitride.

6. The plasma generator defined in claim 1 wherein said dielectric material is aluminum nitride.

7. The plasma generator defined in claim 1 wherein said waveguide assembly is operable to introduce a circularly polarized radio frequency signal into said plasma chamber body.

8. The plasma generator defined in claim 1 wherein said magnet is a solenoidal magnet and said plasma chamber body is a cylindrical body having a central axial bore that constitutes said cavity.

9. An ion beam generator comprising:
- a plasma chamber body having an interior cavity and a beam port opening outwardly from said cavity, said plasma chamber body being formed of a dielectric material;
- a magnet surrounding said plasma chamber body, said magnet being operable to maintain a magnetic field in said cavity;
- a radio frequency waveguide assembly coupled to said plasma chamber body for introducing a radio frequency signal into said plasma chamber body, said waveguide assembly including a solid waveguide being composed of a dielectric material; and
- at least one electrode spaced from said beam port and maintained at an electrical potential relative to said plasma chamber body so as to attract and accelerate ions out of said cavity through said beam port;
- whereby a plasma may be generated and maintained in said cavity by the phenomenon of ion cyclotron resonance upon introduction of a gas into said cavity and the introduction of the radio frequency signal through said waveguide, and whereby ions in said plasma are extracted and accelerated in a beam.

10. The ion beam generator defined in claim 9 wherein said plasma chamber body and said waveguide are matched in impedance so as to minimize reflection of said radio frequency signal at the interface between said plasma chamber body and said waveguide.

11. The ion beam generator defined in claim 10 wherein said plasma chamber body is coupled to said waveguide through a high voltage waveguide isolator.

12. The ion beam generator defined in claim 11 wherein said waveguide isolator includes at least one quarter wave choke joint for preventing emission of radio frequency radiation.

13. The ion beam generator defined in claim 9 wherein said dielectric material is boron nitride.

14. The ion beam generator defined in claim 9 wherein said dielectric material is aluminum nitride.

15. The ion beam generator defined in claim 9 wherein said waveguide assembly is operable to introduce a circularly polarized radio frequency signal into said plasma chamber body.

16. The ion beam generator defined in claim 9 wherein said magnet is a solenoidal magnet and said plasma chamber body is a cylindrical body having a central axial bore that constitutes said cavity.

* * * * *